US008848467B1

(12) United States Patent
Hua et al.

(10) Patent No.: US 8,848,467 B1
(45) Date of Patent: Sep. 30, 2014

(54) INTEGRATED WRITE MUX AND DRIVER SYSTEMS AND METHODS

(71) Applicant: Taiwan Semiconductor Manfacturing Co. Ltd., Hsin-Chu (TW)

(72) Inventors: Chung-Hsien Hua, Hsinchu (TW); Yu-Hao Hsu, Tainan (TW); Chen-Li Yang, Zhubei (TW); Cheng Hung Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/873,526

(22) Filed: Apr. 30, 2013

Related U.S. Application Data

(60) Provisional application No. 61/783,113, filed on Mar. 14, 2013.

(51) Int. Cl.
 *G11C 7/00* (2006.01)
 *G11C 7/12* (2006.01)
 *G11C 8/08* (2006.01)
 *G11C 7/10* (2006.01)

(52) U.S. Cl.
 CPC .. *G11C 7/12* (2013.01); *G11C 8/08* (2013.01); *G11C 7/1078* (2013.01); *G11C 7/1096* (2013.01)
 USPC .............. 365/189.16; 365/154; 365/189.02; 365/189.11; 365/230.02

(58) Field of Classification Search
 CPC ...... G11C 7/12; G11C 7/1078; G11C 7/1096; G11C 8/08; G11C 13/0004; G11C 13/0069; G11C 2213/79
 USPC .............. 365/189.16, 154, 189.02, 189.11, 365/230.02, 230.06
 See application file for complete search history.

(56) References Cited

U.S. PATENT DOCUMENTS

| 6,567,320 | B2 * | 5/2003 | Ando ..................... 365/189.12 |
| 7,184,322 | B2 * | 2/2007 | Takahashi et al. ........ 365/189.02 |
| 7,277,245 | B1 | 10/2007 | Aram et al. |
| 7,660,064 | B2 | 2/2010 | Howley et al. |

* cited by examiner

*Primary Examiner* — Tan T. Nguyen
(74) *Attorney, Agent, or Firm* — Eschweiler & Associates, LLC

(57) ABSTRACT

An integrated driver system is disclosed. The driver system includes decoding logic and a driver portion. The decoding logic is configured to receive select signals and data signals. The driver portion is configured to generate driver signals according to the decoded signals.

20 Claims, 6 Drawing Sheets

INTEGRATED WRITE MUX AND DRIVER SYSTEMS AND METHODS

CROSS REFERENCE TO RELATED APPLICATION

This application is a Non-Provisional Patent Application claiming priority to Provisional Patent Application Ser. No. 61/783,113 filed Mar. 14, 2013 entitled "Integrated Write Mux and Driver Systems and Methods" in the name of chung-Hsien Hua and is hereby incorporated by reference.

BACKGROUND

Most electronic devices of today utilize memory for some portion of their operation. The memory can be used to store information, retrieve information, obtain program code, and the like.

The memory is typically organized into an array of cells, wherein the cells physically store information via write operations and provide stored information via read operations. A particular cell is ready by accessing or selecting the cell and then reading the cell contents or data. Similarly, a cell is written to by accessing or selecting the cell and then by writing data to the cell. A write driver is used to write the data to the selected cell.

DETAILED DESCRIPTION

Figure 1:
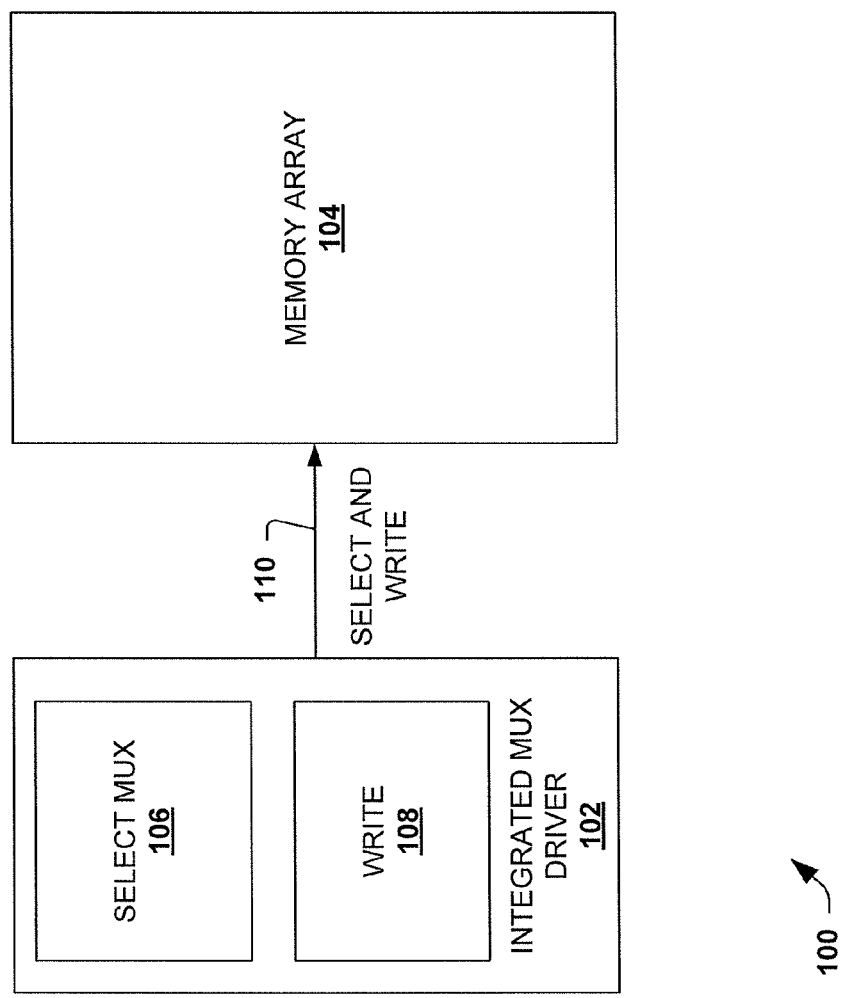
FIG. 1 is a block diagram illustrating a memory access system in accordance with an embodiment of the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Typically, writing data to a memory location or cell involves several steps. The cell to be written to is selected, typically by a multiplexor or "mux". Then, data is written to the selected cell using a write driver. The data to be written is coded and provided to the write driver. To write a "1", BL remains high, and BLB goes low. To write a "0", BL goes low and BLB remains high. Systems and methods are disclosed that integrate the selection of cells and writing of data into a single component, an integrated driver, instead of using separate components as in other approaches.

FIG. 1 is a block diagram illustrating a memory access system 100 in accordance with an embodiment of the disclosure. The system 100 uses an integrated write driver and multiplexor to facilitate memory write operations.

The system 100 includes an integrated multiplexor (mux) and write driver 102 and a memory array 104. The driver 102 provides one or more signals 110 to the memory array 104 in order to select cells for write operations and also to perform write operations on the selected cells.

The memory array 104 includes a plurality of memory cells arranged in columns and/or rows. The cells can be volatile or non/volatile. The memory array 104 typically includes word lines and bitlines, which are used for accessing or selecting the cells. The cells can represent single bits of information or multiple bits of information. Although shown primarily for write operations, the memory array 104 can also be accessed for read operations. Similarly, the wordlines and bitlines are utilized to select or access cells and facilitate reading data from the selected cells.

The driver 102 receives data to be written and cell locations or addresses to write to. The data to be written is typically in the form of high (H) values, low (LOW) values, and the like. The cell locations or addresses are also referred to as cell or mux select signals.

The driver 102 includes a select mux component 106 and a write component 108. The select mux component 106 is responsible for generating a mux/select portion of an integrated signal 110. The mux portion includes or integrates the mux select signals. The write component 108 is responsible for generating a write portion of the integrated signal 110. The write portion includes data to be written to a selected cell. Thus, the select mux component 106 and the write component 108 integrate the select portion and the write portion into the integrated signal 110. Further, the integrated signal 110 includes the select and write portions and is provided to the memory array 104.

On receiving the integrated signal 110, the memory array selects an identified cell or cells and writes the data to the selected cells. Thus, the integrated driver 102 is utilized for selection of cells and writing to the selected cells. In contrast, other approaches require a separate mux circuit and a separate write driver to perform write operations. Further, the integrated driver 102 provides a stronger driving current than other approaches. The stronger driving current is obtained by avoiding additional NMOS stacks. Additionally, the integrated driver 102 mitigates logic high level degradation that can occur with other approaches. This is facilitated by using pull up transistors that pull up logic high levels to suitable values. Finally, the integrated driver 102 breaks cross-coupled PMOS structure utilized in other approaches to facilitate VCCmin operation. The above are at least partially accomplished by using components within the integrated driver 102 to pull up and maintain the driving current and the logic high levels.

Figure 2:
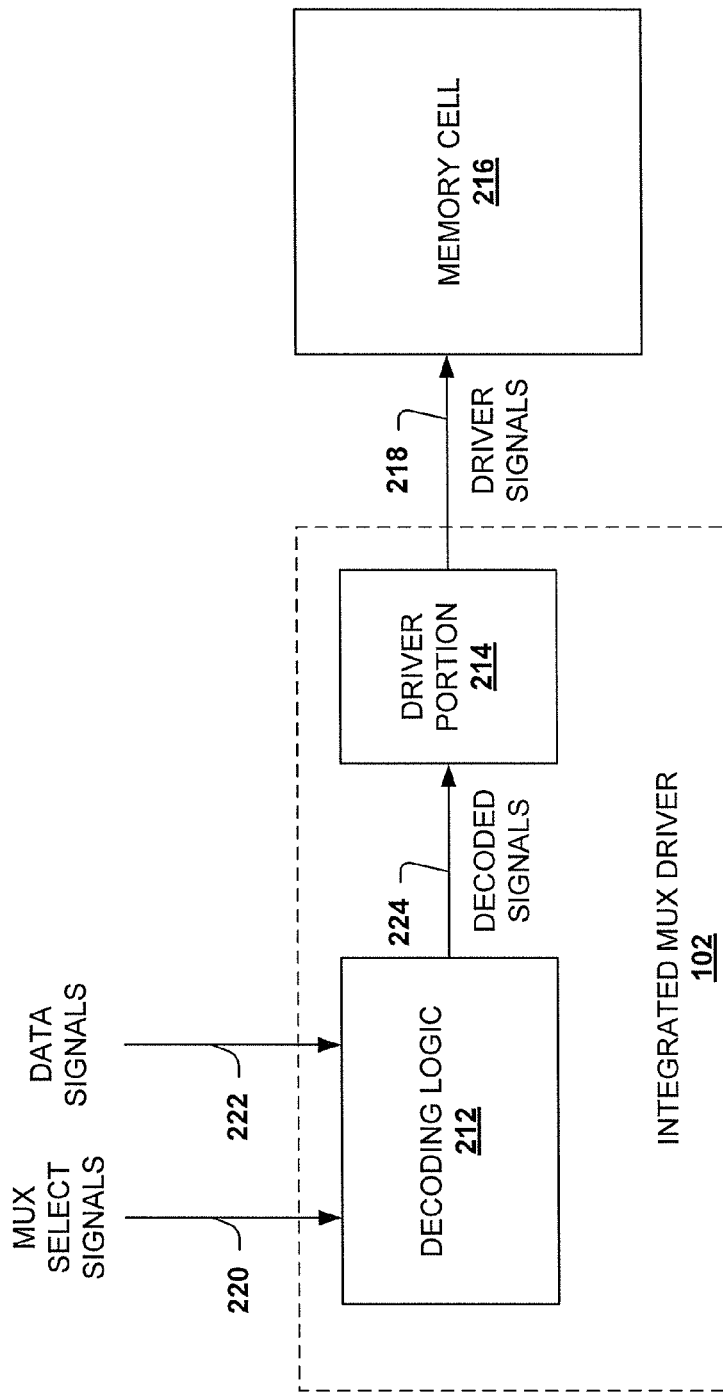
FIG. 2 is a more detailed block diagram illustrating a system for writing to a memory cell utilizing an integrated driver in accordance with an embodiment of the disclosure.

FIG. 2 is a more detailed block diagram illustrating a system 200 for writing to a memory cell utilizing an integrated driver in accordance with an embodiment of the disclosure. The integrated driver is used to instead of a separate multiplexor and separate write driver.

The system 200 includes an integrated mux driver 102 and a memory cell 216. The integrated mux driver 102 provides driver signals 218 to the memory cell 216 to write data to the cell 216.

The integrated mux driver 102 includes decoding logic 212 and a driver portion 214. The decoding logic 212 receives multiplexor select signals 220 and data signals 222. The select signals 220 indicate or identify the memory cell 216 from an array of memory cells, such as described above with regards to FIG. 1. In some embodiments, the select signals 220, for example, include wordlines.

The data signals 222 include data to be written to the memory cell 216. The data signals 222 can represent single and/or multiple bits of information. In one example, the data signals include a high value to represent a logical '1' and a low value to represent a logical '0'.

The decoding logic 212 combines the mux select signals 220 and the data signals 222 into decoded signals 224. The decoded signals 224 combine select and data portions. The decoded signals 224 are provided to the driver portion 214.

The driver portion 214 generates driver signals 218 according to the decoded signals. The driver signals 218 are provided with voltage and current levels sufficient to select the memory cell 216 and write the data to the cell 216. Thus, the driver signals 218 are provided with suitable memory write/drive characteristics including driving current while mitigating logic high level degradation and support using relatively lower operating voltages, referred to as VCCmin or low VCC. The low VCC or VCCmin is a lower operating voltage than a nominal or typical operating voltage for an implementing technology. For example, a system 200 could be implemented using a technology having an implementing operating voltage of 0.64 V or more, but operate with a VCCmin of less than or equal to 0.4 V or less than or equal to 0.3 V. The write/drive characteristics include suitable logic high levels and logic low levels.

It is noted that other approaches attempt to provide improve write/drive characteristics, but tend to trade one for the other. For example, another approach may provide improved driving current, but degrade logic high level. Or, another approach may mitigate logic high level degradation, but require a higher operating voltage.

Below, several more detailed examples of integrated drivers are provided. However, it is appreciated that variations of these drivers are contemplated and in accordance with this disclosure.

Figure 3:
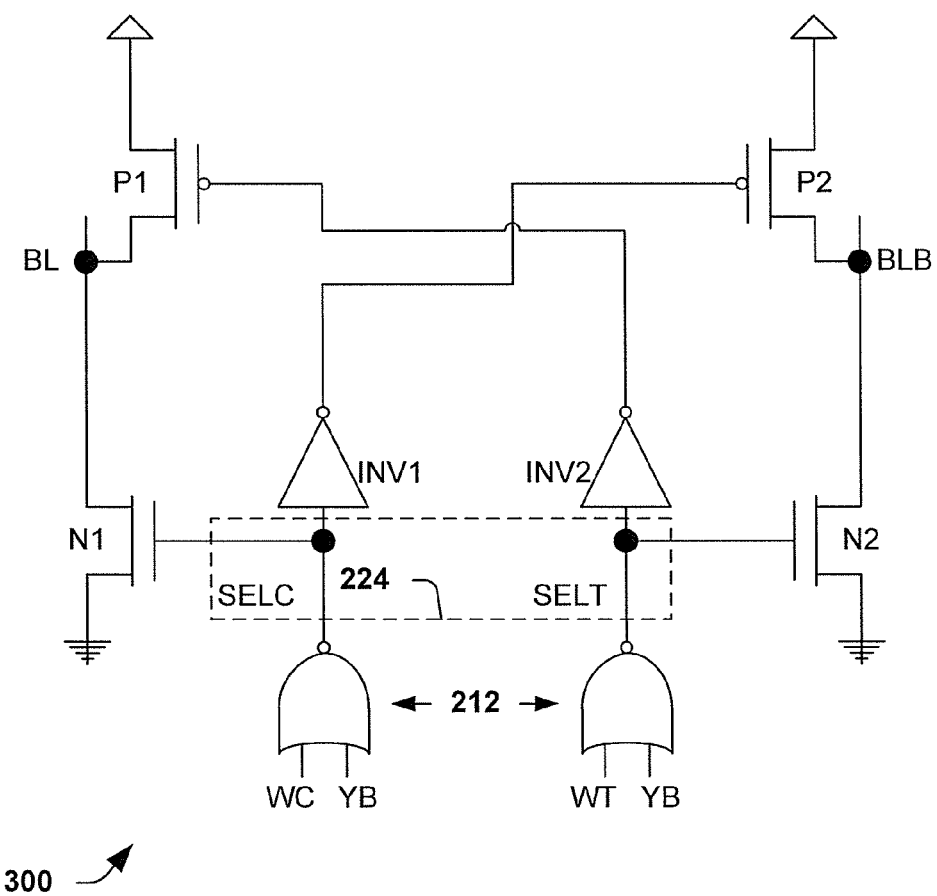
FIG. 3 is a circuit diagram of a driver portion of an integrated driver in accordance with an embodiment of this disclosure.

FIG. 3 is a circuit diagram of a driver portion 300 of an integrated driver in accordance with an embodiment of this disclosure. The driver portion 300 can be utilized for the driver portion 214 of FIG. 2. The driver portion 300 is provided as an example of a suitable driver portion. It is appreciated that other suitable driver portions can be employed.

The driver portion 300 includes a first PMOS transistor P1, a second PMOS transistor P2, a first NMOS transistor N1, a second NMOS transistor N2, a first inverter INV1 and a second inverter INV2. The driver portion 300 generates driver signals in response to decoded signals 224. The driver portion 300 generates driver signals as a bitline BL and bitline bar (complement) BLB signals. The driver signals can be utilized as the driver signals 218 of FIG. 2, described above. The decoded signals 224 include SELC and SELT signals.

In this example, the driver portion 300 provided the driver signals to one or more SRAM cells (not shown). The SRAM cells are single bit cells in this example. An input of INV1 and a gate of N1 receive the SELC signal. A source of N1 is connected to ground and a drain of N1 is connected to the BL. An output of INV1 is connected to a gate of P2. A source of P1 is connected to VDD and a drain of P1 is connected to the BL. An input of INV2 and a gate of N2 receive the SELT signal. A source of N2 is connected to ground and a drain of N2 is connected to the BLB. An output of INV2 is connected to a gate of P1. A source of P2 is connected to VDD and a drain of P2 is connected to the BLB.

The SELC and SELT signals are both low when not writing data into SRAM cells. Thus, the outputs of INV1 and INV2 are high, causing the transistors P1 and P2 to be OFF. Further, the SELC and SELT signals are applied to the gates of the transistors N1 and N2, respectively, turning them OFF as well.

To write a logical '1' to the SRAM cell, SELT goes high and SELC remains low. With SELT high, the transistor N2 is ON, which causes the BLB to go low. Additionally, the transistor P1 is turned ON, which causes the BL to go high. The SELC at low results in turning the transistors N1 and P2 OFF.

To write a logical '0' to the SRAM cell, SELT goes low and SELC goes high. With SELC high, the transistor N1 is ON, which causes the BL to go low. Further, the transistor P2 is turned ON, which causes BLB to go high. The SELT at low causes the transistors N2 and P1 to remain OFF or turn OFF.

It is noted that other approaches can suffer from degraded levels logic high level, such as the logical '1'. However, the presence of the transistors P1 and P2 facilitates the logic high levels by pulling up the BL and BLB toward VDD during write operations.

Decoding logic 212 generates the decoded signals 224, including SELC and SELT. Here, the decoding logic 212 includes a left side NOR gate and a right side NOR gate. The left side NOR gate receives a first select signal WC and a first write signal YB and generates the SELC signal. The SELC signal is the NOR of WC and YB. The right side NOR gate receives a second select signal WT and a second write signal, which in this example is also YB. The SELT signal is the NOR of WT and YB. The signal WT, and its complement, WC includes data to be written. The signal YB is a write signal intended to select the cell and initiate writing the data to the selected cell. The signals YB, WT, and WC are clocked signals generated by a control unit and, in one example, operate in the range of about 50 mV to about 900 mV. It is appreciated that variations in the decoding logic 212 and/or the signals processed by the logic 212 are contemplated.

Figure 4:
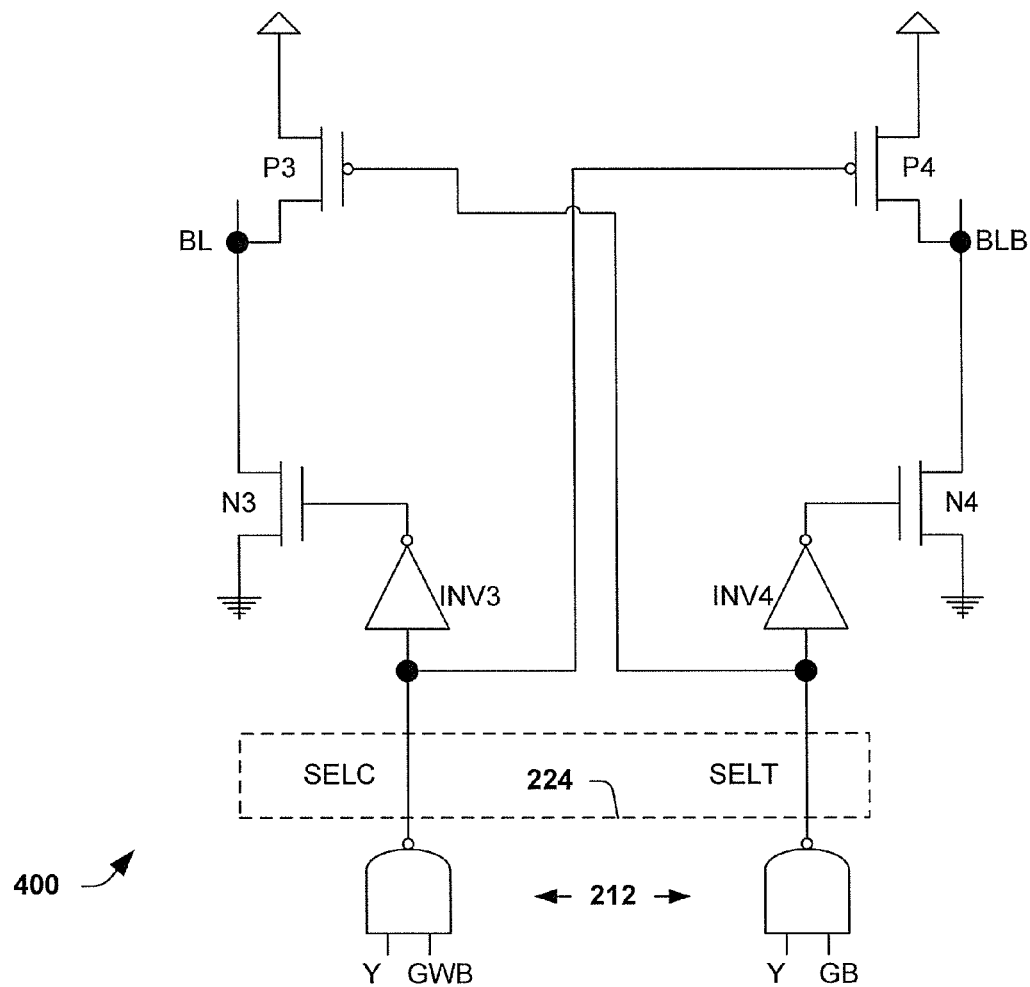
FIG. 4 is a circuit diagram of another driver portion of an integrated driver in accordance with an embodiment of this disclosure.

FIG. 4 is a circuit diagram of another driver portion 400 of an integrated driver in accordance with an embodiment of this disclosure. The driver portion 400 can be utilized for the driver portion 214 of FIG. 2. The driver portion 400 is provided as an example of a suitable driver portion. It is appreciated that other suitable driver portions can be employed.

The driver portion 400 includes a first PMOS transistor P3, a second PMOS transistor P4, a first NMOS transistor N3, a second NMOS transistor N4, a first inverter INV3 and a second inverter INV4. The driver portion 400 generates driver signals in response to decoded signals 224. The driver portion 400 generates driver signals as a bitline BL and bitline bar (complement) BLB signals. The driver signals can be utilized as the driver signals 218 of FIG. 2, described above. The decoded signals 224 include SELC and SELT signals.

In this example, the driver portion 400 provided the driver signals to one or more SRAM cells (not shown). The SRAM cells are single bit cells in this example. An input of INV3 receives the SELC signal. A gate of the transistor P4 also receives the SELC signal. A source of N3 is connected to ground and a drain of N3 is connected to the BL. An output of the first inverter INV3 is connected to a gate of the transistor N3. A source of the transistor P3 is connected to VDD and a drain of the transistor P3 is connected to the BL. An input of the second inverter INV4 receives the SELT signal. The gate of the transistor P3 also receives the SELT signal. A source of the transistor N4 is connected to ground and a drain of the transistor N4 is connected to the BLB. An output of INV4 is connected to a gate of the transistor N4. A source of the transistor P4 is connected to VDD and a drain of the transistor P4 is connected to the BLB.

The SELC and SELT signals are both high when not writing data into SRAM cells. Thus, the outputs of INV3 and INV2 are low, causing the transistors N3 and N4 to be OFF. Further, the SELC and SELT signals (high) are applied to the gates of the transistors P3 and P4, respectively, turning them OFF as well.

To write a logical '1' to the SRAM cell, SELT goes high and SELC remains low. With SELC low, the transistors N4 and P3 are turned ON. The ON of the transistor P3 causes the BL to go high. The transistor N4 causes BLB to go low. With SELT high, the transistors N3 and P4 are turned off.

To write a logical '0' to the SRAM cell, SELT goes low and SELC goes high. With SELC high, the transistors P3 and N4 are turned OFF. SELT being low results in the transistors N3 and P4 being on. As a result, the transistor P4 causes the BLB to go high. The ON transistor N3 causes the BL to go low.

It is noted that other approaches can suffer from degraded levels logic high level, such as the logical '1'. However, the presence of the transistors P3 and P4 facilitates the logic high levels, by driving the connected line (BL or BLB) to high during write operations.

Decoding logic 212 generates the decoded signals 224, including SELC and SELT. Instead of NOR gates, decoding logic 212 uses NAND gates. The decoding logic 212 includes a left side NAND gate and a right side NAND gate. The left side NAND gate receives a first write signal Y and a first select signal GWB. The right side NAND gate receives a second write signal, here it is again Y, and a second select signal GB. The SELC signal is equal to the NAND of Y and GWB and the SELT signal is equal to the NAND of Y and GB. The signal Y is a write signal that selects a cell and initiates writing to the selected cell. GW is a global write signal and GWB is the complement of the global write signal. The signals GW and GWB are non-buffered version of the local write signals WT and WC, respectively. The signals GW and GWB include data to be written. The signals Y, GW and GWB are clocked signals and, in one example, operate in the range of about 50 mV to about 900 mV.

Figure 5:
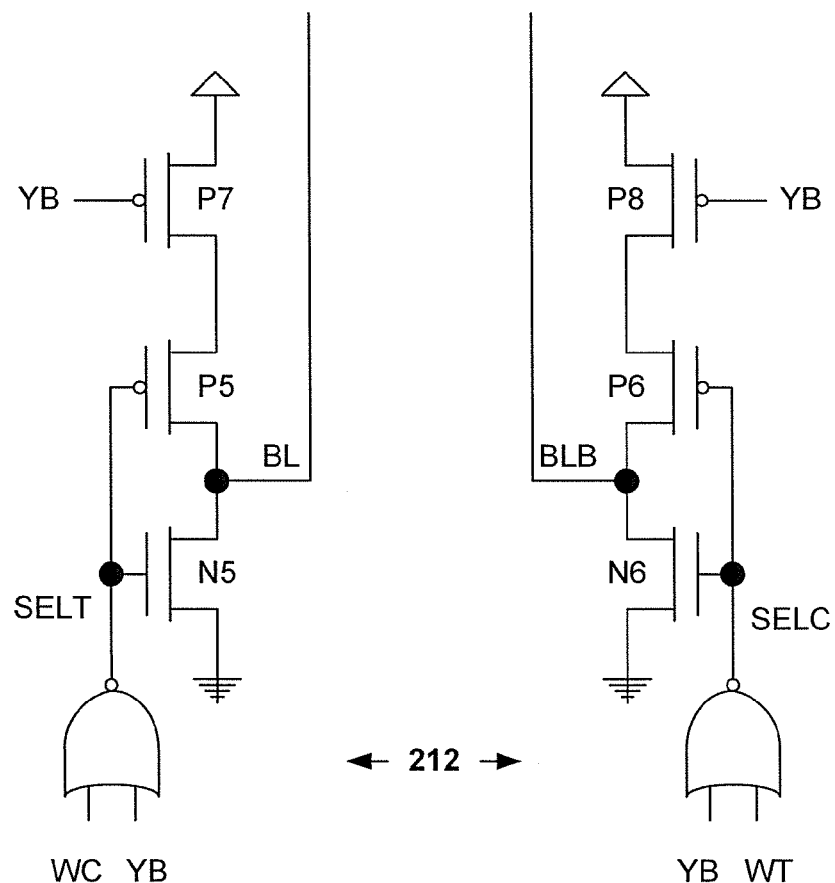
FIG. 5 is a circuit diagram of yet another driver portion of an integrated driver in accordance with an embodiment of this disclosure.

FIG. 5 is a circuit diagram of yet another driver portion 500 of an integrated driver in accordance with an embodiment of this disclosure. The driver portion 500 can also be utilized for the driver portion 214 of FIG. 2. The driver portion 500 is provided as an example of a suitable driver portion. It is appreciated that other suitable driver portions can be employed.

The driver portion 500 includes a first NMOS transistor N5, a first PMOS transistor P5, a second NMOS transistor N6, a second PMOS transistor P6, a third PMOS transistor P7, and a fourth PMOS transistor P8. The driver portion 500 generates driver signals in response to decoded signals 224. The driver portion 500 generates driver signals as a bitline BL and bitline bar (complement) BLB signals. The driver signals can be utilized as the driver signals 218 of FIG. 2, described above. The decoded signals 224 include SELC and SELT signals.

In this example, the driver portion 500 provided the driver signals to one or more SRAM cells (not shown). The SRAM cells are single bit cells in this example. A gate of the transistor N5 and a gate of the transistor P5 receive the SELT signal. A source of the transistor N5 is connected to ground and its drain is connected to a bitline BL. A drain of the transistor P5 is also connected to the BL, while its source is connected to a drain of the transistor P7. A gate of the transistor P7 receives a write signal YB and its source is connected to VDD.

A gate of the transistor N6 and a gate of the transistor P6 receive the SELC signal. A source of the transistor N6 is connected to ground and its drain is connected to a bitline BL. A drain of the transistor P6 is also connected to the BL, while its source is connected to a drain of the transistor P8. A gate of the transistor P8 receives the write signal YB and its source is connected to VDD.

The SELC and SELT signals are both low when not writing data into SRAM cells. This causes the transistors N5 and N6 to be OFF. Further, YB is high, causing the transistors P7 and P8 to turn OFF.

To write a logical '1' to the SRAM cell, SELT goes low and SELC goes high. With SELT low, the transistor N5 is OFF and the transistor P5 is on. The YB signal is also low, turning the transistor P7 ON. Thus, the transistors P5 and P7 pull the BL to VDD or high. With the SELC signal high, the transistor N6 is turned ON, pulling the BLB to ground. Further, the transistor P6 is turned OFF, thereby disconnecting the BLB from the VDD.

To write a logical '0' to the SRAM cell, SELT goes high and the SELC signal goes low. With SELT high, the transistor N5 is turned ON and the transistor P5 is turned OFF. As a result, the transistor N5 pulls the BL to ground or low, thus writing a '0'. The SELC signal is low, which turns the transistor N6 OFF and the transistor P6 ON. The YB signal is low and turns the transistor P8 ON.

Here, the transistors P5, P7, P6 and P8 maintain the logic high levels by pulling the lines to high at the proper times.

Decoding logic 212 generates the decoded signals 224, including SELC and SELT. The decoding logic 212 includes a left side NOR gate and a right side NOR gate. The left side NOR gate receives a first select signal WC and a first write signal YB and generates the SELC signal. The SELC signal is the NOR of WC and YB. The right side NOR gate receives a second select signal WT and a second write signal, which in this example is also YB. The SELT signal is the NOR of WT and YB. It is appreciated that variations in the decoding logic 212 and/or the signals processed by the logic 212 are contemplated. These signals are also described above with regard to FIG. 3.

Figure 6:
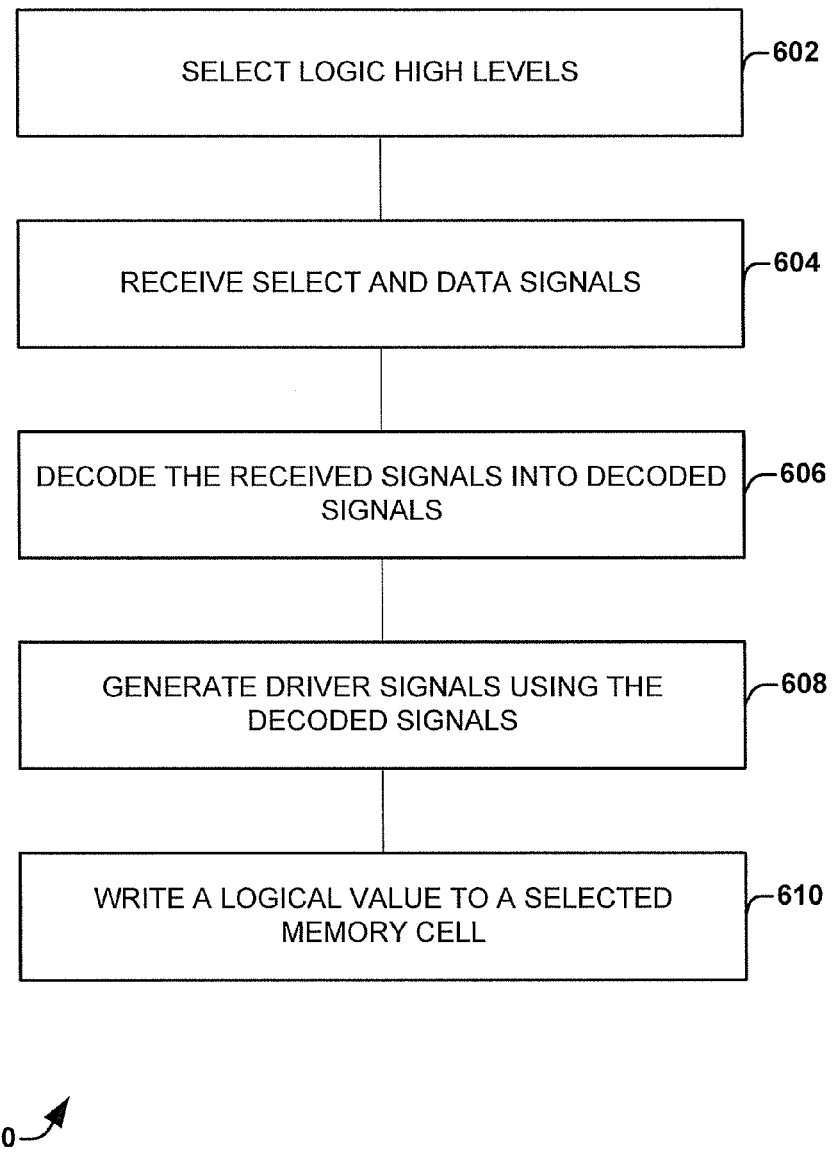
FIG. 6 is a flow diagram illustrating a method of writing a logical value to a memory cell.

FIG. 6 is a flow diagram illustrating a method 600 of writing a logical value to a memory cell. The method 600 uses an integrated driver approach to mitigate logic high level degradation and to facilitate higher driving current.

The method 300 begins at block 602, where suitable high and low logic levels are selected. The logic levels correspond to voltage values or ranges that indicate logical values. For example, the selected high logic level is a voltage level at which or above a logical '1' is indicated. Similarly, the selected low logic level is a voltage level at which or below a logical '0' is indicated. The selected high and low logic levels can be independent of transistor types or technology utilized to fabricate the integrated driver.

Select and data signals are received at block 604. The select signals identify which cell or cells of an array of memory cells is to be operated on. The data signals indicate logical value(s) to be written to the identified cells. In one example, the select signals include wordlines.

The select signals and the data signals are decoded and integrated into decoded signals at block 606. A suitable decoding logic, such as one of those describe above, is utilized to develop the decoded signals. In one example, the select and data signals are integrated into first and second decoded signals, such as the SELC and SELT signals described above.

Driver signals are generated from the decoded signals at block 608. The driver signals are generated having the selected high and low logic levels. This is accomplished utilizing a driver portion, such as those described above. The driver portion includes PMOS transistors configured to pull up the high logic levels. As a result, the high logic levels meet or exceed a minimum operating voltage for a memory array.

The generated driver signals are applied to a memory cell and write a logical value to the memory cell at block 610. The generated driver signals identify and select the memory cell for writing. The generated driver signals also write the logical values originally provided in the data signals.

It is appreciated that suitable variations of the method 600 are contemplated.

It will be appreciated that while reference is made throughout this document to exemplary structures in discussing aspects of methodologies described herein (e.g., the structure presented in above figures, while discussing the methodology set forth in above), that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

An integrated driver system is disclosed. The driver system includes decoding logic and a driver portion. The decoding logic is configured to receive select signals and data signals. The driver portion is configured to generate driver signals according to the decoded signals.

A driver portion system is disclosed. The system includes a first NMOS transistor and a first PMOS transistor. The first NMOS transistor is coupled to a bitline and ground. The first NMOS transistor is configured to write a logical '0' to the bitline in response to a first signal received at its gate. The first PMOS transistor is coupled to the bitline and VDD. The first PMOS transistor is configured to write a logical '1' to the bitline in response to a second signal received at its gate.

A method of writing a logical value to a memory cell is disclosed. A suitable logic high level is selected for driver signals. Select signals and data signals are received. The select signals and data signals are decoded into decoded signals. The driver signals are generated from the decoded signals. The driver signals have or comply with the selected logic high level.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. An integrated driver system comprising:
    decoding logic configured to receive select signals and data signals and to generate integrated decoded signals from the select signals and the data signals; and
    a driver portion configured to generate driver signals according to the decoded signals.

2. The system of claim 1, wherein the driver signals indicate a logical value to write and identify a memory cell to write to.

3. The system of claim 1, further comprising a memory array having a plurality of memory cells.

4. The system of claim 3, wherein the driver signals write a logical value to one of the plurality of memory cells.

5. The system of claim 3, wherein the memory cells are multi-bit memory cells.

6. The system of claim 1, wherein the driver signals include a first signal and a second signal.

7. The system of claim 6, wherein the first signal and the second signal are high, which results in no write operation being performed.

8. The system of claim 1, wherein the decoding logic includes first and second NOR gates connected in parallel.

9. The system of claim 1, wherein the driver portion comprises:
    a first inverter configured to receive a first signal of the decoded signals and to generate a first inverter output;
    a second inverter configured to receive a second signal of the decoded signals and to generate a second inverter output;
    a first NMOS transistor configured to receive the first signal at its gate, coupled to ground at its drain, and coupled to a bitline at its drain;
    a first PMOS transistor coupled to the bitline at its drain, coupled to VDD at its source and configured to receive the second inverter output;
    a second NMOS transistor configured to receive the first signal at its gate, coupled to ground at its drain, and coupled to a bitline bar at its drain; and
    a second PMOS transistor coupled to the bitline bar at its drain, coupled to VDD at its source and configured to receive the first inverter output.

10. The system of claim 1, wherein the driver portion comprises:
    a first inverter configured to receive a first signal of the decoded signals and to generate a first inverter output;
    a second inverter configured to receive a second signal of the decoded signals and to generate a second inverter output;
    a first NMOS transistor configured to receive the first inverter output at its gate, coupled to ground at its drain, and coupled to a bitline at its drain;
    a first PMOS transistor coupled to the bitline at its drain, coupled to VDD at its source and configured to receive the first signal;
    a second NMOS transistor configured to receive the first inverter output at its gate, coupled to ground at its drain, and coupled to a bitline bar at its drain; and
    a second PMOS transistor coupled to the bitline bar at its drain, coupled to VDD at its source and configured to receive the second signal.

11. The system of claim 1, wherein the select signals include wordline select signals.

12. The system of claim 1, wherein the data signals include write current signals.

13. A driver portion system:
- a first NMOS transistor coupled to a bitline and ground, wherein the first NMOS transistor is configured to write a logical '0' to the bitline in response to a first signal received at its gate; and
- a first PMOS transistor coupled to the bitline and VDD, wherein the first PMOS transistor is configured to write a logical '1' to the bitline in response to a second signal received at its gate.

14. The system of claim 13, further comprising an inverter configured to receive the first signal at its input and to provide the second signal at its output, wherein the second signal is an inverted version of a third signal.

15. The system of claim 13, further comprising an inverter configured to receive the second signal at its input and to provide the first signal at its output, wherein the first signal is an inverted version of a third signal.

16. The system of claim 13, further comprising:
- a second NMOS transistor coupled to a complement bitline and ground, wherein the second NMOS transistor is configured to write a logical '0' to the bitline in response to an inverted version of the second signal received at its gate; and
- a second PMOS transistor coupled to the bitline and VDD, wherein the second PMOS transistor is configured to write a logical '1' to the bitline in response to an inverted version of the first signal received at its gate.

17. A method of writing a logical value to a memory cell, the method comprising:
- selecting a suitable logic high level for driver signals;
- receiving select signals and data signals;
- decoding the select signals and the data signals into decoded signals; and
- generating the driver signals from the decoded signals, wherein the driver signals have the selected logic high level.

18. The method of claim 17, wherein the selected high level is greater than or equal to a minimum operating voltage.

19. The method of claim 17, further comprising selecting a suitable low level for the driver signals.

20. The method of claim 17, further comprising receiving the driver signals at a memory cell and writing a logical value indicated by the data signals.

* * * * *